(12) United States Patent
Nakamura et al.

(10) Patent No.: US 12,341,319 B2
(45) Date of Patent: Jun. 24, 2025

(54) SEMICONDUCTOR LASER

(71) Applicant: NATIONAL INSTITUTE OF ADVANCED INDUSTRIAL SCIENCE AND TECHNOLOGY, Tokyo (JP)

(72) Inventors: Takahiro Nakamura, Tsukuba (JP); Ryunosuke Kuroda, Tsukuba (JP); Hidefumi Akiyama, Tokyo (JP); Changsu Kim, Tokyo (JP); Takashi Ito, Tokyo (JP); Hidekazu Nakamae, Tokyo (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 840 days.

(21) Appl. No.: 17/622,581

(22) PCT Filed: Aug. 21, 2020

(86) PCT No.: PCT/JP2020/031627
§ 371 (c)(1),
(2) Date: Dec. 23, 2021

(87) PCT Pub. No.: WO2020/262711
PCT Pub. Date: Dec. 30, 2020

(65) Prior Publication Data
US 2022/0360044 A1    Nov. 10, 2022

(30) Foreign Application Priority Data

Jun. 25, 2019    (JP) .................................. 2019-117574

(51) Int. Cl.
*H01S 5/0625* (2006.01)
*H01S 5/042* (2006.01)
(Continued)

(52) U.S. Cl.
CPC ........ *H01S 5/06253* (2013.01); *H01S 5/0428* (2013.01); *H01S 5/0601* (2013.01); *H01S 5/3432* (2013.01)

(58) Field of Classification Search
CPC ... H01S 5/0428; H01S 5/0601; H01S 5/06253
See application file for complete search history.

(56) References Cited

U.S. PATENT DOCUMENTS 5,177,752 A    1/1993  Ohya et al.
5,410,159 A *  4/1995  Sugawara ............... H01L 33/30
                                                    257/85
(Continued)

FOREIGN PATENT DOCUMENTS

JP    S59-104191 A    6/1984
JP    H03-087085 A    4/1991
(Continued)

OTHER PUBLICATIONS

Liu et al. "Gain-Switched Picosecond Pulse ( < 10 ps) Generation from 1.3 pm Laser Diodes," Jun. 6, 1989, IEEE Journal of Quantum Electronics, vol. 25. No. 6, pp. 1417-1425. (Year: 1989).*
(Continued)

*Primary Examiner* — Michael Carter
(74) *Attorney, Agent, or Firm* — Oliff PLC

(57) ABSTRACT

A semiconductor laser including: an optical resonator that has a first compound semiconductor layer containing an n-type impurity, a second compound semiconductor layer containing a p-type impurity, and a light-emitting layer provided between the first compound semiconductor layer and the second compound semiconductor layer; and a pulse injection means that injects excitation energy for a subnanosecond duration into the optical resonator, wherein the optical resonator has a multi-section structure separated into at least one gain region and at least one absorption region, and the semiconductor laser generates optical pulses having (Continued)

a pulse width shorter than 2.5 times the photon lifetime in the optical resonator.

9 Claims, 6 Drawing Sheets

(51) Int. Cl.
*H01S 5/06* (2006.01)
*H01S 5/343* (2006.01)

(56) References Cited

U.S. PATENT DOCUMENTS

| | | | |
|---|---|---|---|
| 6,654,153 | B2 | 11/2003 | Kaneko |
| 2003/0012235 | A1 | 1/2003 | Yokoyama |
| 2009/0245310 | A1* | 10/2009 | Miyake ............ H01S 5/22 257/E21.085 |
| 2012/0099185 | A1 | 4/2012 | Yokoyama et al. |
| 2014/0295595 | A1* | 10/2014 | Raring ............ H01S 5/2009 438/29 |
| 2014/0307750 | A1 | 10/2014 | Kono et al. |
| 2016/0341664 | A1* | 11/2016 | Rothberg ....... H01L 27/14603 |

FOREIGN PATENT DOCUMENTS

| | | |
|---|---|---|
| JP | H10-229252 A | 8/1998 |
| JP | 2003-031897 A | 1/2003 |
| JP | 2005-039099 A | 2/2005 |
| JP | 2009-049310 A | 3/2009 |
| JP | 2012-094622 A | 5/2012 |
| JP | 2013-105813 A | 5/2013 |

OTHER PUBLICATIONS

Jul. 14, 2023 Search Report issued in European Patent Application No. 20833403.7.
Jenohara, Hiroyuki et al.; "Static and Dynamic Response of Multiple-Quantum-Well Voltage-Controlled Bistable Laser Diodes"; IEEE Journal of Quantum Electronics; IEEE; vol. 32; No. 5; May 1996; pp. 873-883.
Shen A. et al.; "Reduced Timing Jitter of Two-Section 1.55-μm Laser Diodes Under Gain-/Loss-Switching Regime at Multigigahertz Rates"; IEEE Photonics Technology Letters; IEEE; vol. 10; No. 12; Dec. 1998; pp. 1694-1696.
Williams K.A et al.; "Picosecond Pulse Generation with Ultralow Jitter in 1.5-μm Multicontact MQW Lasers Using Q-Switching"; IEEE Photonics Technology Letters; IEEE; vol. 5; No. 8; Aug. 1993; pp. 867-869.
Nov. 2, 2020 International Search Report issued in International Patent Application No. PCT/JP2020/031627.

* cited by examiner (a)

(b)

(a)

(b)

SEMICONDUCTOR LASER

TECHNICAL FIELD

The present invention relates to a semiconductor laser.

DESCRIPTION OF RELATED ART

A semiconductor laser is used as a light source for optical disks and optical communications. For example, Patent Document 1 proposes a GaAs/AlGaAs-based semiconductor laser.

PRIOR ART DOCUMENT

Patent Document

[Patent Document 1] Japanese Unexamined Patent Publication No. S59-104191

SUMMARY OF THE INVENTION

Problems to be Solved by the Invention

An object of the present invention is to provide a semiconductor laser that generates an ultrashort pulse.

Means for Solving the Problem

According to an aspect of the present invention,
there is provided a semiconductor laser including:
an optical resonator that has a first compound semiconductor layer containing an n-type impurity, a second compound semiconductor layer containing a p-type impurity, and a light-emitting layer provided between the first compound semiconductor layer and the second compound semiconductor layer; and
a pulse injection means that injects excitation energy for a sub-nanosecond duration into the optical resonator,
wherein the optical resonator has a multi-section structure separated into at least one gain region and at least one absorption region, and the semiconductor laser generates an optical pulse having a pulse width shorter than 2.5 times a photon lifetime in the optical resonator.

Advantage of the Invention

According to the present invention, there is provided a semiconductor laser that generates an ultrashort pulse.

DETAILED DESCRIPTION OF THE INVENTION

Description of the Embodiment of the Invention

<Knowledges Obtained by the Inventors>

First, the knowledges obtained by the inventors will be described.

As an ultrashort pulse laser in which a pulse width of a generated optical pulse is from femtoseconds to several picoseconds, for example, a solid-state laser using a mode-locking method is known. However, such a solid-state laser is high in cost and large in size, and its operation is unstable without temperature control and a clean environment. Therefore, an ultrashort pulse semiconductor laser that is low in cost, compact in size, and provides highly stable operation has been desired.

As a method for generating a short pulse in the semiconductor laser, for example, a mode-locking method and a gain switching method are known.

As for the semiconductor laser using the mode-locking method, there is a report of occurrence of the ultrashort pulse from femtoseconds to several picoseconds. However, the semiconductor laser using the mode-locking method suffers from problems of low robustness and a lack of arbitrariness in the repetition frequency.

On the other hand, the semiconductor laser using the gain switching method can operate more stably compared to that using the mode-locking method, and the repetition frequency can be arbitrarily set. However, as for a semiconductor laser using the gain switching method, the lower limit of the pulse width of the generated optical pulse is theoretically limited by the photon lifetime in the optical resonator, and the pulse width of the optical pulse that can actually be generated is only at least 2.5 times the photon lifetime in the optical resonator. Therefore, it is considered to be difficult to generate an ultrashort pulse from femtoseconds to several picoseconds.

The inventors of the present application have studied intensively on the above-mentioned events. As a result, the present inventors have found that since the optical resonator has a multi-section structure, and the excitation energy is injected for a sub-nanosecond duration into the optical resonator, an optical pulse having a pulse width shorter than 2.5 times the photon lifetime in the optical resonator can be obtained, and even an optical pulse having a pulse width shorter than the photon lifetime can be obtained, and thus an ultrashort pulse from femtoseconds to several picoseconds can be stably generated.

The present invention is based on the above knowledges found by the inventors.

Detailed Description of Embodiment of the Invention

Next, an embodiment of the present invention will be described below with reference to the drawings. The invention is not limited to these examples, but is intended to be indicated by claims, and to include modifications within the meaning and scope equivalent to the claims.

First Embodiment of the Present Invention (1) Configuration of Semiconductor Laser First, a configuration of the semiconductor laser 10 of the present embodiment will be described.

Figure 1:
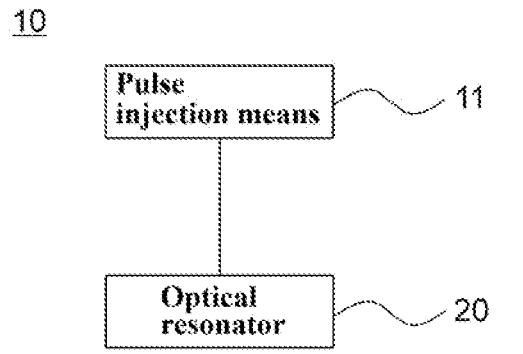
FIG. 1 is a schematic configuration diagram of a semiconductor laser 10 according to a first embodiment of the present invention.

FIG. 1 is a schematic configuration diagram of a semiconductor laser 10 of the present embodiment. As illustrated in FIG. 1, the semiconductor laser 10 of the present embodiment is provided with a pulse injection means 11 and an optical resonator 20.

The pulse injection means 11 is configured, for example, to apply a pulse current to the optical resonator 20. The pulse current applied by the pulse injection means 11 can drive the semiconductor laser 10.

Figure 2:
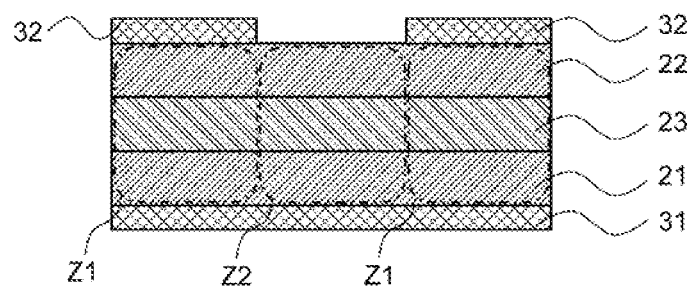
FIG. 2(a) is a longitudinal cross-sectional diagram of an optical resonator 20 according to the first embodiment of the present invention, along the longitudinal direction.
FIG. 2(b) is a cross-sectional diagram of the optical resonator 20 according to the first embodiment of the present invention, perpendicular to the longitudinal direction.
Figure 2:
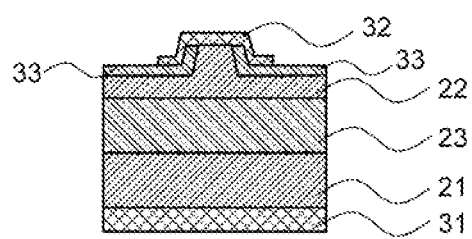

FIG. 2(a) is a longitudinal cross-sectional diagram of the optical resonator 20 of the present embodiment, along the longitudinal direction. FIG. 2(b) is a cross-sectional diagram of the optical resonator 20 of the present embodiment, perpendicular to the longitudinal direction. As illustrated in FIG. 2 (a) and FIG. 2 (b), the optical resonator 20 of the present embodiment includes a first compound semiconductor layer 21, a second compound semiconductor layer 22, and a light-emitting layer 23.

In the present specification, the "longitudinal direction" of the optical resonator 20 or the like means a direction parallel to the light emitted from the semiconductor laser 10, and can be paraphrased as an "oscillation direction".

The first compound semiconductor layer 21 is provided on a bottom of the optical resonator 20, for example. The first compound semiconductor layer 21 contains an n-type impurity. Examples of the first compound semiconductor layer 21 include AlGaAs-based compound semiconductor doped with Si.

The second compound semiconductor layer 22 is provided on a top of the optical resonator 20, for example. The second compound semiconductor layer 22 contains a p-type impurity. Examples of the second compound semiconductor layer 22 include AlGaAs-based compound semiconductor doped with C. As illustrated in FIG. 2(b), the second compound semiconductor layer 22 has, for example, a convex portion formed, as viewed from the longitudinal direction of the optical resonator 20.

The light-emitting layer 23 is provided between the first compound semiconductor layer 21 and the second compound semiconductor layer 22. The light-emitting layer 23 has a multiple quantum well structure, which will be described later.

Figure 3:
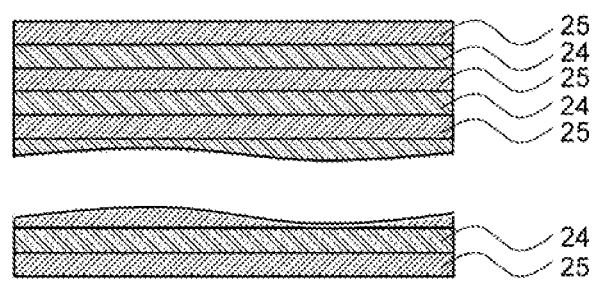
FIG. 3 is a longitudinal cross-sectional diagram of a light-emitting layer 23 according to the first embodiment of the present invention, along the longitudinal direction.

FIG. 3 is a longitudinal cross-sectional diagram of the light-emitting layer 23, along the longitudinal direction. As illustrated in FIG. 3, the light-emitting layer 23 has the multiple quantum well structure in which a plurality of well layers 24 and a plurality of barrier layers 25 are alternately stacked. Examples of a combination of (well layer 24, barrier layer 25) include (GaAs, $Al_xGa_{(1-x)}As$).

The light-emitting layer 23 has a multiple quantum well structure in which the well layers 24 and the barrier layers 25 are stacked for at least five periods. When a light-emitting layer 23 having a less than five-period quantum well structure is used, it is difficult to generate an optical pulse having a pulse width shorter than 2.5 times the photon lifetime $t_{ph}$ of the optical resonator 20. In contrast, when a light-emitting layer 23 having at least five-period multiple quantum well structure is used, an optical pulse having a pulse width shorter than 2.5 times the photon lifetime $t_{ph}$ of the optical resonator 20 can be generated. Preferably, the light-emitting layer 23 has an at least ten-period multiple quantum well structure. Thereby, the pulse width of the generated optical pulse can be made shorter. More preferably, the light-emitting layer 23 has an at least twenty-period multiple quantum well structure. Thereby, the pulse width of the generated optical pulse can be made much shorter. In addition, a peak intensity of the generated optical pulse can be improved.

Note that the photon lifetime $t_{ph}$ of the optical resonator 20 is defined by the following formula (1):
[Math. 1]

In the formula (1), $v_g$ is a group velocity. $a_{in}$ is an internal loss in a transparent carrier density. $a_m$ is a mirror loss. The group velocity $v_g$ is defined by the following formula (2):
[Math. 2]

In the formula (2), c is a speed of light. $n_g$ is a group refractive index. The mirror loss $a_m$ is defined by the following formula (3):
[Math. 3]

In the formula (3), L is a resonator length. $R_1$ is a reflectance of one reflecting mirror. $R_2$ is a reflectance of the other reflecting mirror. In a typical optical resonator with a resonator length L of around a few hundred micrometers, the photon lifetime $t_{ph}$ is, for example, around a few picoseconds. The photon lifetime $t_{ph}$ of the optical resonator 20 of the present embodiment is specifically 2 ps, for example.

According to the common knowledge in the prior art, it has been considered that increasing the number of periods in the multiple quantum well structure increases the amount of the injected carrier, which makes it difficult for the semiconductor laser to operate at high speed.

In a conventional semiconductor laser using the gain switching method, since the pulse width of the generated optical pulse is limited by the photon lifetime $t_{ph}$ of the optical resonator, it is considered theoretically impossible to generate the optical pulse having a pulse width shorter the photon lifetime $t_{ph}$. In addition, since the pulse width of the optical pulse that can actually be generated is only at least 2.5 times the photon lifetime $t_{ph}$ of the optical resonator, it is considered to be difficult to generate an optical pulse having a pulse width shorter than 2.5 times the photon lifetime $t_{ph}$.

In contrast, since the semiconductor laser 10 of the present embodiment dares to adopt the at least five-period multiple quantum well structure, and the excitation energy is injected for a sub-nanosecond duration, an optical pulse having a short pulse width can be generated which is beyond the common knowledge expectation in the prior art. The semiconductor laser 10 of the present embodiment can generate an optical pulse having a pulse width shorter than 2.5 times the photon lifetime $t_{ph}$ of the optical resonator, which has not been attained by the conventional semiconductor laser using the gain switching method. Further, the semiconductor laser of the present embodiment can generate an optical pulse having a pulse width shorter than the photon lifetime $t_{ph}$.

For example, the optical resonator 20 of the present embodiment has gain regions Z1 and absorption regions Z2, as illustrated in FIG. 2(a). The gain region Z1 and the absorption region Z2 are alternately arranged along the longitudinal direction (oscillation direction) of the optical resonator 20. For example, the gain region Z1 is arranged at each of both ends in the longitudinal direction of the optical resonator 20, and the absorption region Z2 is arranged between the gain regions Z1. A structure in which the optical resonator has the gain regions Z1 and the absorption region Z2 as described above is called a multi-section structure. Since the optical resonator 20 has the multi-section structure, the transition from gain to absorption of the time domain in the laser oscillation spectrum can be made steeper. Thereby, the tail component of the generated optical pulse can be made smaller, and the pulse width of the generated optical pulse can be made shorter.

The width of the absorption region Z2 in the longitudinal direction can be chosen arbitrarily. The width of the absorption region Z2 in the longitudinal direction can be changed so that the pulse width and the peak intensity of the generated optical pulse can be controlled.

The width of the absorption region Z2 in the longitudinal direction is preferably 1% or more and 50% or less of the width of the optical resonator 20 in the longitudinal direction. When the width of the absorption region Z2 in the longitudinal direction is less than 1% of the width of the optical resonator 20 in the longitudinal direction, the effect of shortening the pulse width of the generated optical pulse can be hardly obtained. In contrast, when the width of the absorption region Z2 in the longitudinal direction is 1% or more of the width of the optical resonator 20 in the longitudinal direction, the pulse width of the optical pulse can be efficiently made shorter. On the other hand, when the width of the absorption region Z2 in the longitudinal direction is more than 50% of the width of the optical resonator 20 in the longitudinal direction, the peak intensity of the generated optical pulse may be lower. In contrast, when the width of the absorption region Z2 in the longitudinal direction is 50% or less of the width of the optical resonator 20 in the longitudinal direction, the peak intensity of the generated optical pulse can be improved.

Now, an electrode structure of the optical resonator 20 of the present embodiment will be described. For example, the optical resonator 20 of the present embodiment has a first electrode 31, a second electrode 32, and an insulation layer 33, as illustrated in FIG. 2(b).

The first electrode 31 is provided, for example, to cover the first compound semiconductor layer 21, and is electrically connected to the first compound semiconductor layer 21. The second electrode 32 is provided, for example, to cover a part of the second compound semiconductor layer 22, and is electrically connected to the second compound semiconductor layer 22. Each of the second electrodes 32 is located on a top of the gain region Z1, as illustrated in FIG. 2(a). The insulation layer 33 is provided, for example, on both sides of the convex portion of the second compound semiconductor layer 22 as viewed from the longitudinal direction of the optical resonator 20. The first electrode 31 and the second electrode 32 are configured to be connected to a pulse injection means 11.

The insulation layer 33 acts as a dielectric of a capacitor to reduce a stray capacitance of the optical resonator 20. As the insulation layer 33, for example, an insulator such as polyimide can be used. The insulation layer 33 is preferably configured so that the stray capacitance of the optical resonator 20 is made sufficiently small. Since the stray capacitance of the optical resonator 20 is made small, the semiconductor laser 10 can be driven at high speed. Specifically, for example, it is possible to inject the excitation energy for a sub-nanosecond duration into the optical resonator 20. In other words, it is preferable that the insulation layer 33 is configured so that the excitation energy can be injected for the sub-nanosecond duration into the optical resonator 20.

It is also preferable that an area of the second electrode 32 is sufficiently small. Since the area of the second electrode 32 is made small, the semiconductor laser 10 can be driven at high speed. Specifically, for example, it is possible to inject the excitation energy for a sub-nanosecond duration into the optical resonator 20. In other words, it is preferable that the area of the second electrode 32 is set so that the excitation energy can be injected for the sub-nanosecond duration into the optical resonator 20.

The optical resonator 20 of the present embodiment has the above-mentioned electrode structure. Thereby, it is possible to inject the excitation energy for a sub-nanosecond duration into the gain region Z1 of the optical resonator 20.

(2) Method of Driving Semiconductor Laser

Next, a method of driving the semiconductor laser 10 of the present embodiment will be described.

Figure 4:
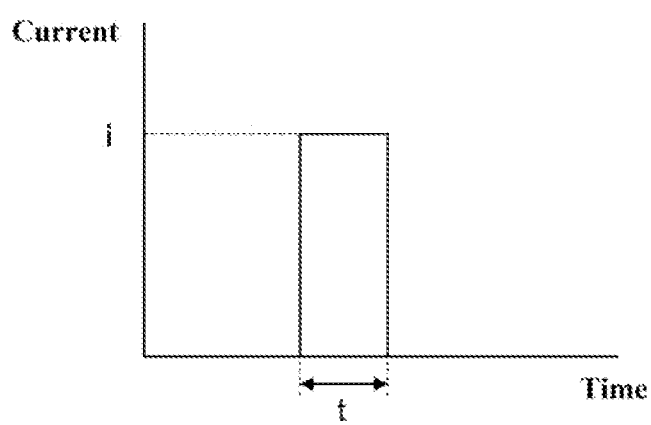
FIG. 4 is a schematic diagram of a pulse current applied to the optical resonator 20 according to the first embodiment of the present invention.

FIG. 4 is a schematic diagram of a pulse current applied to the optical resonator 20. As illustrated in FIG. 4, a pulse current applied to the optical resonator 20 is, for example, a rectangular pulse current having a duration t and a height i. A pulse injection means 11 can apply the above-mentioned pulse current to the optical resonator 20 at any timing.

The duration t of the pulse current applied to the optical resonator 20 is sub-nanosecond, specifically, less than 1 ns. Since the duration t of the pulse current is less than 1 ns, an optical pulse having a pulse width shorter than 2.5 times the photon lifetime $t_{ph}$ of the optical resonator 20 can be generated.

The height i of the pulse current applied to the optical resonator 20 is preferably at least twice the threshold current $i_{th}$ of the steady oscillation of the optical resonator 20. When the height i of the pulse current is less than twice the threshold current $i_{th}$, it becomes difficult to realize fast carrier dynamics. In contrast, when the height i of the pulse current is at least twice the threshold current $i_{th}$, it is possible to realize fast carrier dynamics. Thereby, the gain-absorption change of the time domain in the laser oscillation spectrum can be made steeper, and the pulse width of the generated optical pulse can be made shorter. Further, the height i of the pulse current is more preferably at least 5 times the threshold current $i_{th}$. Thereby, the pulse width of the generated optical pulse can be made much shorter.

Figure 5:
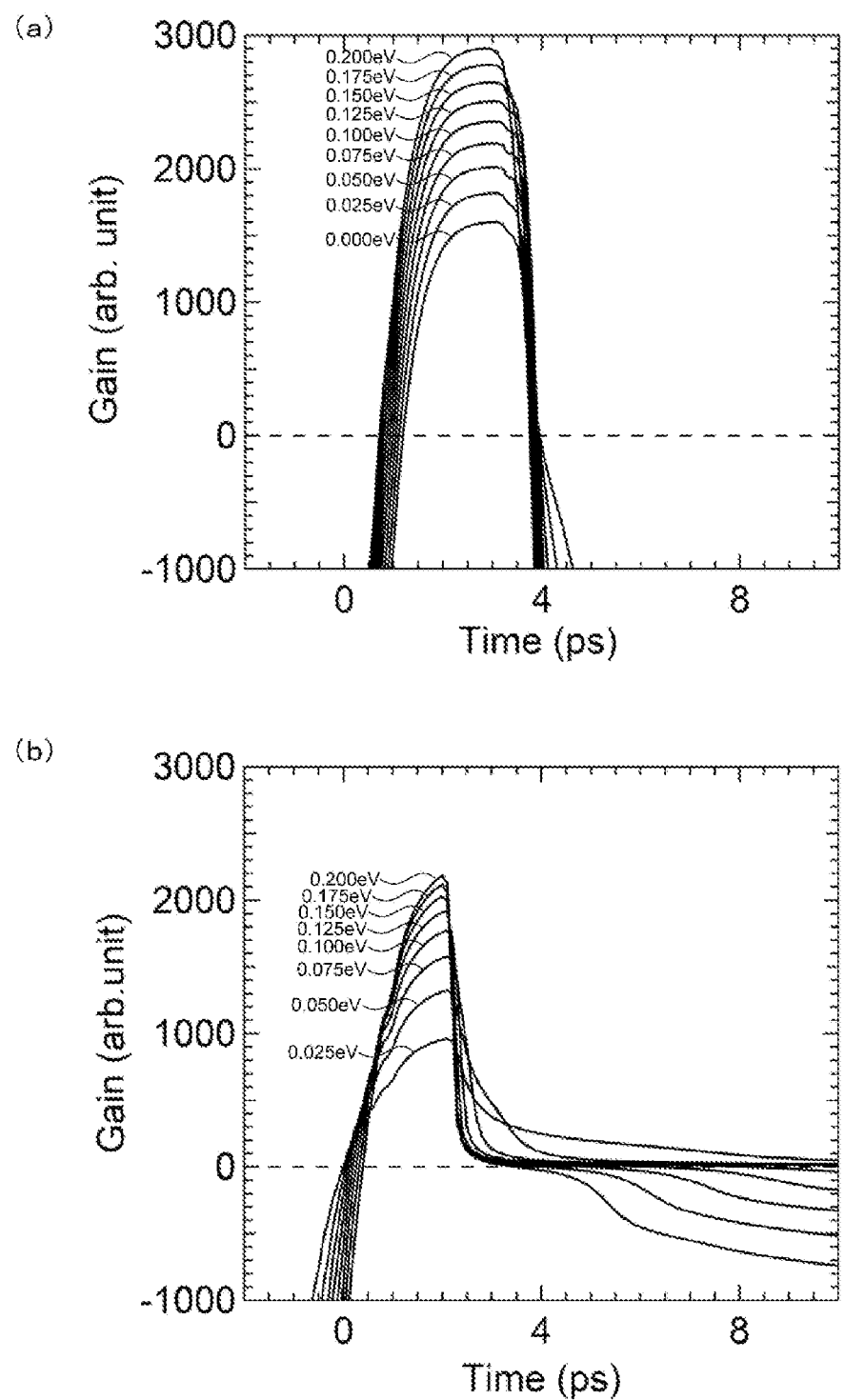
FIG. 5(a) is a graph illustrating a gain-absorption change of a time domain in a laser oscillation spectrum of the first embodiment of the present invention.
FIG. 5(b) is a graph illustrating a gain-absorption change of the time domain in a laser oscillation spectrum of a comparative embodiment.

FIG. 5(a) is a graph illustrating the gain-absorption change of the time domain in the laser oscillation spectrum of a semiconductor laser having a multiple quantum well structure and a multi-section structure according to the present embodiment. FIG. 5(b) is a graph illustrating the gain-absorption change of the time domain in a laser oscillation spectrum of a semiconductor laser having a double heterostructure and a single-section structure according to the comparative embodiment. In FIG. 5 (a) and FIG. 5 (b), a positive value on the vertical axis indicates a gain, and a negative value indicates an absorption.

As illustrated in FIG. 5(b), in the semiconductor laser according to the comparative embodiment, the change from gain to absorption is not made steeper, and a tail-trailing transition is observed. Therefore, the tail component of the generated optical pulse becomes larger, and the pulse width of the generated optical pulse may become longer. In contrast, in the present embodiment, the change from gain to absorption is made steeper in all energy bands (0.000 eV to 0.200 eV), and transition involving sharp rising and falling edges is observed, as illustrated in FIG. 5(a). Therefore, the tail component of the generated optical pulse can be made smaller, and the pulse width of the generated optical pulse can be made shorter. The present inventors have also confirmed that the pulse width of the generated optical pulse can be made shorter by at least one of the multiple quantum well structure and the multi-section structure as compared to the comparative embodiment.

Figure 6:
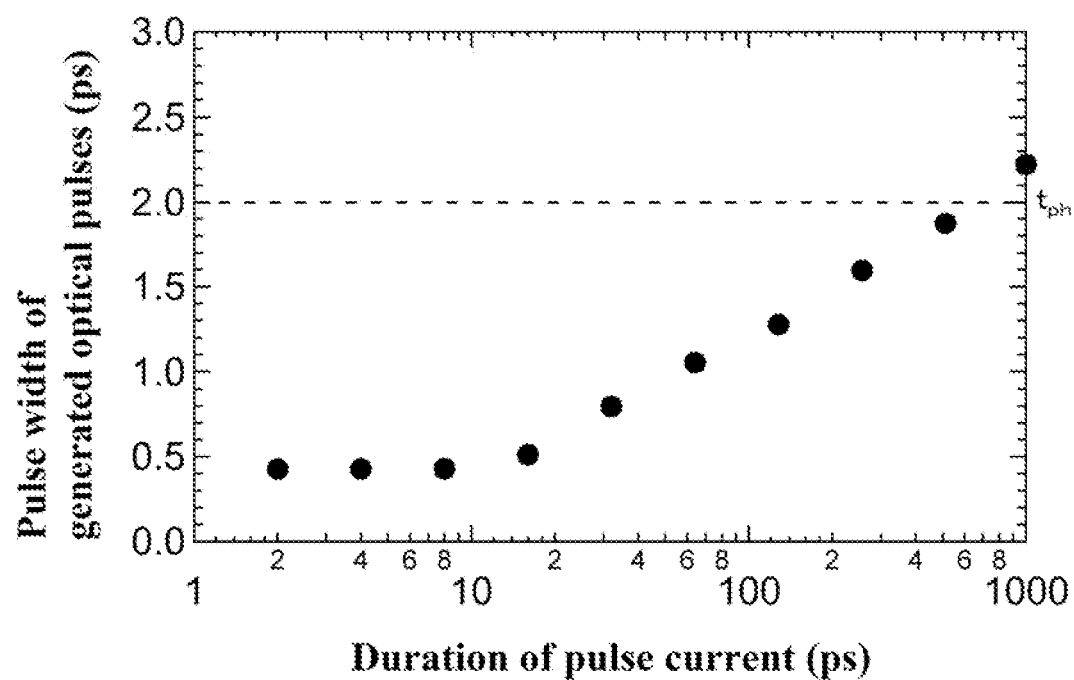
FIG. 6 is a graph illustrating an example of a relationship between a duration t of a pulse current applied to an optical resonator 20 according to the first embodiment of the present invention and a pulse width of a generated optical pulse.

FIG. 6 is a graph illustrating an example of a relationship between a duration t (that is, a duration t for which the excitation energy is injected into the optical resonator 20) of a pulse current applied to the optical resonator 20 of the present embodiment and a pulse width of a generated optical pulse. In the present embodiment, as illustrated in FIG. 6, it is possible to generate an optical pulse having a pulse width shorter than 2.5 times the photon lifetime $t_{ph}$ of the optical resonator 20 by the configuration and the driving method of the semiconductor laser 10 mentioned above. Further, an optical pulse having a pulse width shorter than the photon lifetime $t_{ph}$ can be preferably generated. These effects are beyond the common knowledge expectation in the prior art, and are considered to be the result of a mechanism different from that of the conventional gain switching method. Such a new mechanism is referred to herein as a "super gain switching method".

In an example illustrated in FIG. 6, the photon lifetime $t_{ph}$ of the optical resonator 20 is 2.0 ps, and 2.5 times, 2.0 times, and 1.5 times that value are 5.0 ps, 4.0 ps, and 3.0 ps, respectively. In an example illustrated in FIG. 6, when the duration t of the pulse current applied to the optical resonator 20 is 1 ns (1000 ps), the pulse width of the generated optical pulse can be made as short as about 2.2 ps, which is slightly more than the photon lifetime $t_{ph}$ of the optical resonator 20. Accordingly, it is understood that since the duration t is less than 1 ns (sub-nanosecond), the pulse width of the generated optical pulse can be shorter than 2.5 times, preferably shorter than 2.0 times, and more preferably shorter than 1.5 times the photon lifetime $t_{ph}$ of the optical resonator 20. Moreover, since the duration t of the pulse current is, for example, less than 600 ps, the pulse width of the optical pulse can be made shorter than the photon lifetime $t_{ph}$ of the optical resonator 20. Furthermore, since the duration t of the pulse current is, for example, less than 70 ps, the pulse width of the optical pulse can be femtosecond range (less than 1 ps).

As described above, since the duration t for which the excitation energy is injected into the optical resonator 20 is appropriately set within a range of, for example, less than 1 ns (sub-nanosecond), it is possible to generate an optical pulse having a short pulse width that has not been obtained with the conventional semiconductor laser using the gain switching method. The duration t may be appropriately set according to the pulse width to be generated. The duration t may be appropriately set as needed so that the pulse width is shorter than 2.5 times the photon lifetime $t_{ph}$ of the optical resonator 20, for example, or so that the pulse width is shorter than the photon lifetime $t_{ph}$ of the optical resonator 20, for example, or so that the pulse width is less than 1 ps, for example. An aspect in which the duration t is set within a range of less than 1 ns (sub-nanosecond) is illustrated. However, in order to more reliably make the pulse width shorter, the duration t may be set within a range of less than 900 ps, for example, or may be set within a range of less than 800 ps, for example, or may be set within a range of less than 700 ps, for example, or may be set within a range of less than 600 ps, for example, or may be set within a range of less than 500 ps, for example, or may be set within a range of less than 400 ps, for example, or may be set within a range of less than 300 ps, for example, or may be set within a range of less than 200 ps, for example, or may be set within a range of less than 100 ps, for example.

The lower limit of the duration t is not particularly limited, but is exemplified by, for example, 2 ps or more (and, for example, 10 ps or more). In this example, when the duration t is less than 2 ps (or less than 10 ps), the effect of shortening the pulse width of the optical pulse is saturated. In contrast, when the duration t is 2 ps or more (or 10 ps or more), it is possible to efficiently control the pulse width of the optical pulse. In this example, the pulse width can be made as short as about 0.4 ps.

(3) Effect of the Present Embodiment

According to the present embodiment, one or more of the following effects are achieved.

(a) The optical resonator 20 of the present embodiment has the multi-section structure. As a result, the transition from gain to absorption of the time domain in the laser oscillation spectrum can be made steeper. Accordingly, the tail component of the generated optical pulse can be made smaller, and the pulse width of the generated optical pulse can be made shorter.

Here, the conventional semiconductor laser using the gain switching method has been considered to have difficulty in generating the optical pulse having the pulse width shorter than 2.5 times the photon lifetime $t_{ph}$ of the optical resonator, as mentioned above.

In contrast, in the present embodiment, since the multi-section structure and the super gain switching method are combined, the ultrashort pulse can be generated which is beyond the common knowledge expectation in the prior art. The semiconductor laser 10 of the present embodiment can generate an optical pulse having a pulse width shorter than 2.5 times the photon lifetime $t_{ph}$ of the optical resonator 20, which has not been attained by the conventional semiconductor laser using the gain switching method. Preferably, it is possible to generate the optical pulse having the pulse width shorter than the photon lifetime $t_{ph}$ of the optical resonator 20. As a result, an ultrashort pulse from femtoseconds to several picoseconds can be stably generated.

(b) The light-emitting layer 23 of the present embodiment has a multiple quantum well structure in which the well layers 24 and the barrier layers 25 are stacked for at least five periods. Therefore, it is possible to generate an optical pulse having a pulse width shorter than 2.5 times the photon lifetime $t_{ph}$ of the optical resonator 20. Preferably, it is possible to generate the optical pulse having the pulse width shorter than the photon lifetime $t_{ph}$ of the optical resonator 20.

Here, according to the common knowledge in the prior art, it has been considered that increasing the number of periods in the multiple quantum well structure increases the amount of the injected carrier, which makes it difficult for the semiconductor laser to operate at high speed.

In addition, the conventional semiconductor laser using the gain switching method has been considered to have difficulty in generating the optical pulse having the pulse width shorter than 2.5 times the photon lifetime $t_{ph}$ of the optical resonator, as mentioned above.

In contrast, since the semiconductor laser 10 of the present embodiment dares to adopt the at least five-period multiple quantum well structure, and uses the super gain switching method, an optical pulse having a short pulse width can be generated which is beyond the common knowledge expectation in the prior art. The semiconductor laser 10 of the present embodiment can generate an optical pulse having a pulse width shorter than 2.5 times the photon lifetime $t_{ph}$ of the optical resonator 20, which has not been attained by the conventional semiconductor laser using the gain switching method. Preferably, it is possible to generate the optical pulse having the pulse width shorter than the photon lifetime $t_{ph}$ of the optical resonator 20. As a result, an ultrashort pulse from femtoseconds to several picoseconds can be stably generated.

(c) Since the light-emitting layer 23 of the present embodiment has the at least ten-period multiple quantum well structure, the pulse width of the generated optical pulse can be made much shorter. Moreover, since the light-emitting layer 23 of the present embodiment has the at least twenty-period multiple quantum well structure, the pulse width of the generated optical pulse can be made much shorter. In addition, a peak intensity of the generated optical pulse can be improved.

(d) The insulation layer 33 of the present embodiment is preferably configured so that the stray capacitance of the optical resonator 20 is made sufficiently small. Since the stray capacitance of the optical resonator 20 is made small, the semiconductor laser 10 can be driven at high speed. Specifically, for example, it is possible to inject the excitation energy for a sub-nanosecond duration into the optical resonator 20.

(e) It is also preferable that an area of the second electrode 32 of the present embodiment is sufficiently small. Since the area of the second electrode 32 is made small, the semiconductor laser 10 can be driven at high speed. Specifically, for example, it is possible to inject the excitation energy for a sub-nanosecond duration into the optical resonator 20.

(f) The duration t of the pulse current applied to the optical resonator 20 of the present embodiment is sub-nanosecond, specifically, less than 1 ns. Thereby, it is possible to generate an optical pulse having a pulse width shorter than 2.5 times the photon lifetime $t_{ph}$ of the optical resonator 20.

(g) The height i of the pulse current applied to the optical resonator 20 of the present embodiment is preferably at least twice the threshold current $i_{th}$ of the steady oscillation of the optical resonator 20. Thereby, fast carrier dynamics can be realized. Therefore, the gain-absorption change of the time domain in the laser oscillation spectrum can be made steeper, and the pulse width of the generated optical pulse can be made shorter. Further, the height i of the pulse current is more preferably at least 5 times the threshold current $i_{th}$. Thereby, the pulse width of the generated optical pulse can be made much shorter.

(4) Modified Examples of the First Embodiment

The above-mentioned embodiment can be changed as in modified examples illustrated below, if necessary. Hereinafter, only elements different from those in the above-mentioned embodiment will be described, and the elements substantially the same as those described in the above-mentioned embodiment will be designated by the same reference numerals and the description thereof will be omitted.

(4-1) Modified Example 1 of the First Embodiment

Figure 7:
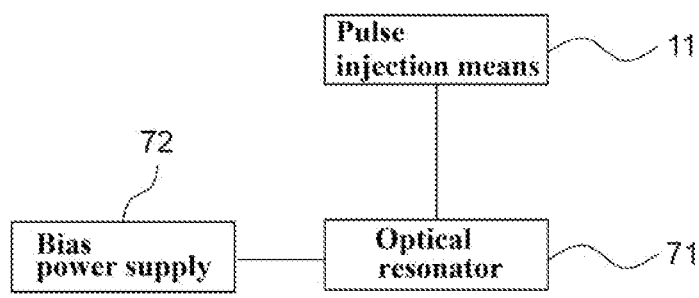
FIG. 7(a) is a schematic configuration diagram of the semiconductor laser 70 according to a modified example 1 of the first embodiment of the present invention.
FIG. 7(b) is a longitudinal cross-sectional diagram of an optical resonator 71 according to the modified example 1 of the first embodiment of the present invention, along the longitudinal direction.
Figure 7:
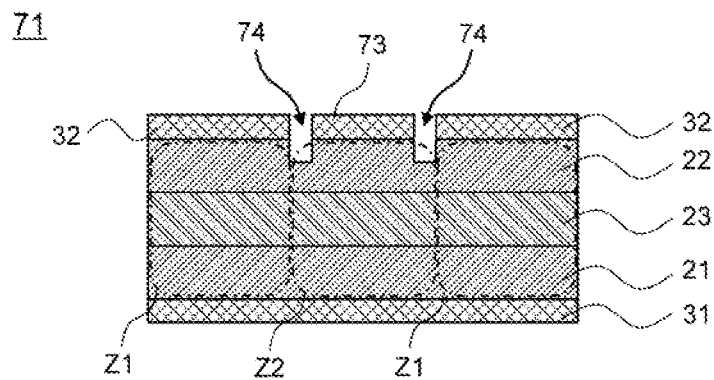

FIG. 7(a) is a schematic configuration diagram of a semiconductor laser 70 of this modified example. As illustrated in FIG. 7(a), the semiconductor laser 70 of this modified example is different from the semiconductor laser 10 of the first embodiment in that the semiconductor laser 70 has a bias power supply 72 as a means for applying a reverse bias voltage described later.

FIG. 7(b) is a longitudinal cross-sectional diagram of the optical resonator 71 of this modified example, along the longitudinal direction. As illustrated in FIG. 7(b), the optical resonator 71 of this modified example is different from the optical resonator 20 of the first embodiment in that the optical resonator 71 has a third electrode 73. The third electrode 73 is provided on a top of the absorption region Z2 so as to cover a part of the top of the second compound semiconductor layer 22, and is electrically connected to the second compound semiconductor layer 22. A separation groove 74 is provided between the second electrode 32 and the third electrode 73, and is configured so that the second electrode 32 and the third electrode 73 do not come into electrical contact with each other.

In this modified example, when a pulse current is applied to the gain region Z1 of the optical resonator 71 via the first electrode 31 and the second electrode 32, the bias power supply 72 is used to apply a voltage to the absorption region Z2 of the optical resonator 71 via the first electrode 31 and the third electrode 73. The pulse current applied to the gain region Z1 is considered to be forward bias, while the voltage applied to the absorption region Z2 is considered to be reverse bias. Since the reverse bias voltage is applied to the absorption region Z2, the pulse width of the generated optical pulse can be fine-tuned and calibrated by controlling the amount of the applied reverse bias voltage, even when there is a tolerance in the fabrication accuracy of the optical resonator 71. Thereby, the production yield of the semiconductor laser equipment can be improved. In addition, a peak intensity of the generated optical pulse can be controlled.

(4-2) Modified Example 2 of the First Embodiment

Figure 8:
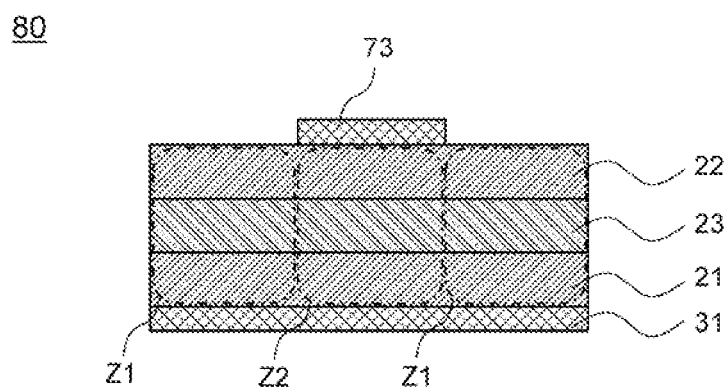
FIG. 8 is a longitudinal cross-sectional diagram of an optical resonator 80 according to a modified example 2 of the first embodiment of the present invention, along the longitudinal direction.

FIG. 8 is a longitudinal cross-sectional diagram of the optical resonator 80 of this modified example, along the longitudinal direction. As illustrated in FIG. 8, the optical resonator 80 of this modified example is different from the optical resonator 20 of the first embodiment in that the optical resonator 80 does not have the second electrode 32 and the insulation layer 33, but has a third electrode 73.

In this modified example, instead of applying a pulse current to the optical resonator 80, the excitation energy is injected by irradiating the optical resonator 80 with an excitation light from above as a pulse injection means. In this case, a part of the excitation light is reflected by the third electrode 73, so that the excitation energy due to the excitation light can be injected only into the gain region Z1. As a light source of the excitation light, for example, a titanium sapphire laser can be used.

The duration t of the excitation light of this modified example is sub-nanoseconds, specifically less than 1 ns. Since the duration t of the excitation light is less than 1 ns, an optical pulse having a pulse width shorter than 2.5 times the photon lifetime $t_{ph}$ of the optical resonator 80 can be generated.

In this modified example, the reverse bias voltage may be applied to the absorption region Z2 of the optical resonator 80 via the first electrode 31 and the third electrode 73, as in the modified example 1 of the first embodiment. Since the reverse bias voltage is applied to the absorption region Z2, the same effect as that in the modified example 1 of the first embodiment can be obtained.

In this modified example, since the excitation energy is injected into the optical resonator 80 by the excitation light, there is no need to provide the second electrode 32 and the insulation layer 33, and thus the electrode structure can be simplified. As a result, this modified example can be performed more easily compared to the first embodiment.

(4-3) Modified Example 3 of the First Embodiment

Figure 9:
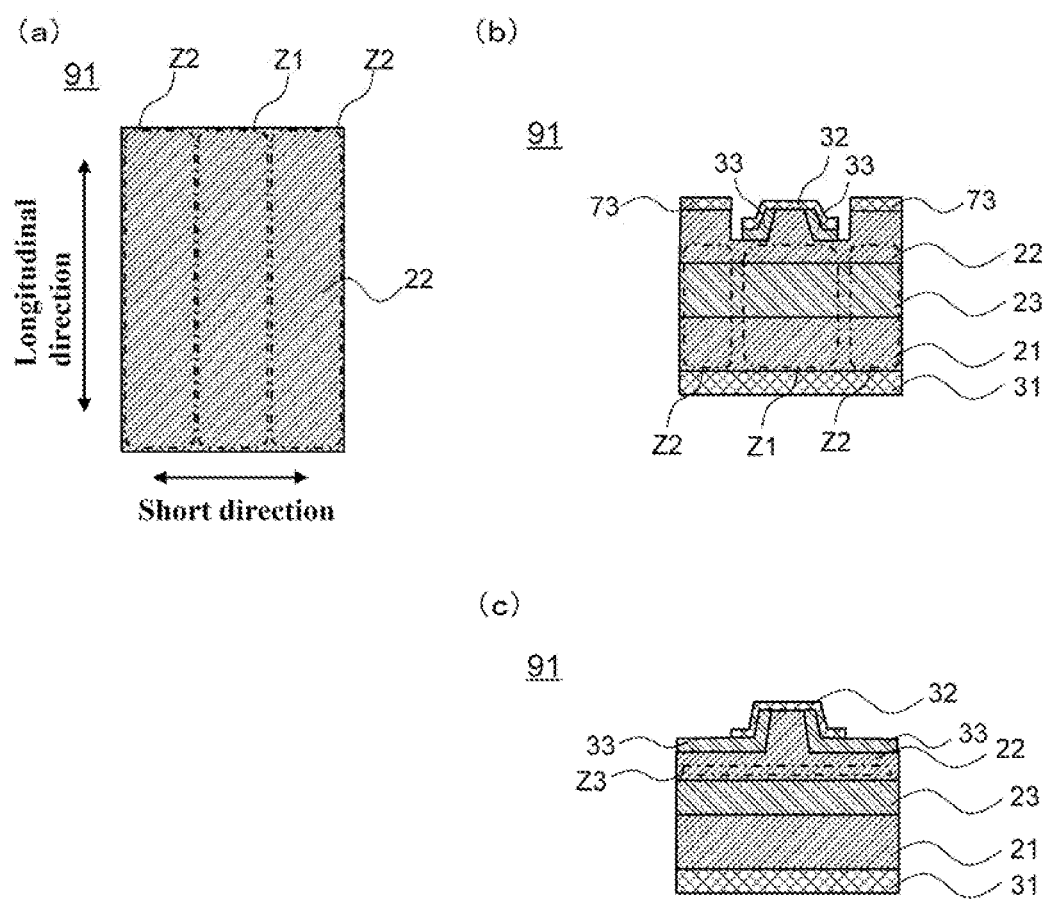
FIG. 9(a) is a transverse cross-sectional diagram of an optical resonator 91 according to a modified example 3 of the first embodiment of the present invention, parallel to the longitudinal direction.
FIG. 9(b) is a schematic cross-sectional diagram (cross-sectional diagram perpendicular to the longitudinal direction) illustrating an example of the optical resonator 91.
FIG. 9(c) is a schematic cross-sectional diagram (cross-sectional diagram perpendicular to the longitudinal direction) illustrating another example of the optical resonator 91.

FIG. 9(a) is a longitudinal cross-sectional diagram of the optical resonator 91 of this modified example, parallel to the longitudinal direction. As illustrated in FIG. 9(a), the optical resonator 91 of this modified example is different from the optical resonator 20 of the first embodiment in the arrangement of the gain region Z1 and the absorption region Z2.

For example, as illustrated in FIG. 9(a), the gain region Z1 and the absorption region Z2 of this modified example are alternately arranged along a direction that intersects the longitudinal direction of the optical resonator 91 (hereinafter referred to as a "short direction") in the optical resonator 91 as viewed in planar view. For example, the absorption region Z2 is arranged at each of both ends in the short direction of the optical resonator 91, and the gain region Z1 is arranged between the absorption regions Z2.

FIG. 9(b) is a schematic cross-sectional diagram (cross-sectional diagram perpendicular to the longitudinal direction) illustrating an example of the optical resonator 91 of this modified example. As illustrated in FIG. 9(b), in the optical resonator 91 of this modified example, the third electrode 73 is provided at each of both ends in the short direction of the second compound semiconductor layer 22, for example. In this modified example, the reverse bias voltage is applied to the absorption region Z2 of the optical resonator 91 via the first electrode 31 and the third electrode 73. Since a reverse bias voltage is applied to the absorption region Z2, it is possible to promote the light absorption in the absorption region Z2 even when the absorption region Z2 is not arranged along the oscillation direction (longitudinal direction) of the optical resonator 91. Thereby, the tail component of the generated optical pulse can be made smaller, and the pulse width of the generated optical pulse can be made shorter. In addition, a peak intensity of the generated optical pulse can be improved, compared to the first embodiment.

FIG. 9(c) is a schematic cross-sectional diagram (cross-sectional diagram perpendicular to the longitudinal direction) illustrating another example of the optical resonator 91 of this modified example. As illustrated in FIG. 9(c), the optical resonator 91 of this modified example is provided with an ion implantation region Z3 in a part of the second compound semiconductor layer 22, for example. The ion implantation region Z3 may be provided in a part of the light-emitting layer 23, or may be provided at a boundary between the second compound semiconductor layer 22 and the light-emitting layer 23. In this modified example, ion implantation is performed in the ion implantation region Z3 so as to make the ion implantation region Z3 function as the absorption region. Thereby, the tail component of the generated optical pulse can be made smaller, and the pulse width of the generated optical pulse can be made shorter. Moreover, the electrode structure can be simplified as compared with the first embodiment.

Another Embodiment of the Present Invention

Although embodiments of the present invention have been specifically described, the present disclosure is not limited to the embodiments described above, and various modifications can be made without departing from the scope of the present invention.

For example, the first embodiment mentioned above has been explained for a case where the gain region Z1 is placed at each of both ends in the longitudinal direction of the optical resonator 20, and the absorption region Z2 is placed between the gain regions Z1. For example, the modified example 3 of the first embodiment mentioned above has been explained for a case where the absorption region Z2 is placed at each of both ends in the short direction of the optical resonator 91, and the gain region Z1 is placed between the absorption regions Z2. However, the arrangement of the gain region Z1 and the absorption region Z2 is not limited to the above-mentioned form, and can be changed in various ways.

For example, the gain region Z1 may be arranged at one end in the longitudinal direction of the optical resonator, and the absorption region Z2 may be arranged at the other end in the longitudinal direction of the optical resonator. Alternatively, for example, the gain region Z1 may be arranged at one end in the short direction of the optical resonator, and the absorption region Z2 may be arranged at the other end in the short direction of the optical resonator. Alternatively, for example, three or more gain regions Z1 are arranged along the longitudinal or short direction of the optical resonator, and a plurality of the absorption regions Z2 are arranged between each adjacent pair of the gain regions Z1. Alternatively, for example, a plurality of gain regions Z1 may be arranged in a grid pattern along the longitudinal direction and the short direction of the optical resonator, and a plurality of absorption regions Z2 may be arranged between the gain regions Z1.

As mentioned above, the arrangement of the gain region Z1 and the absorption region Z2 may be changed so that the pulse width and the peak intensity of the generated optical pulse can be controlled.

EXAMPLES

Next, examples according to the present invention will be described. These examples are just a few examples of the present invention, and the present invention is not limited to these examples.

(1) Preparation of Optical Resonator

Sample 1 of the optical resonator was produced as follows.

A GaAs substrate was prepared, and $Al_{0.33}Ga_{0.67}As$ doped with 6 to $7 \times 10^{17}$ cm$^{-3}$ of Si was epitaxially grown on the GaAs substrate as a first compound semiconductor layer to a thickness of 2000 nm.

The well layers (GaAs) and the barrier layers ($Al_{0.33}Ga_{0.67}As$) were stacked for 50 periods on the first compound semiconductor layer to form a multiple quantum well structure as a light-emitting layer. The thicknesses of the well layer and the barrier layer were 12 nm and 10 nm, respectively. Therefore, the thickness of the light-emitting layer was 1100 nm.

$Al_{0.33}Ga_{0.67}As$ doped with 6 to $7 \times 10^{17}$ cm$^{-3}$ of C was epitaxially grown as the second compound semiconductor layer on the light-emitting layer to a thickness of 1700 nm.

Sample 1 had a single-section structure without the absorption region. The first electrode was provided on the bottom of the first compound semiconductor layer. Both ends in the longitudinal direction of the optical resonator were cleaved surfaces, and the width of the optical resonator in the longitudinal direction was 250 µm. The photon lifetime in the optical resonator was 2.2 ps. Thus, Sample 1 of the optical resonator was obtained.

Sample 2 had a multi-section structure, and a 10 µm absorption region was provided between the gain regions at both ends in the longitudinal direction of the optical resonator, and the third electrode was provided on the top of the absorption region. Except for the above, Sample 2 was prepared in the same manner as Sample 1.

Sample 3 had a multi-section structure, and a 20 µm absorption region was provided between the gain regions at both ends in the longitudinal direction of the optical resonator, and the third electrode was provided on the top of the absorption region. Except for the above, Sample 3 was prepared in the same manner as Sample 1.

Sample 4 had a multi-section structure, and a 30 µm absorption region was provided between the gain regions at both ends in the longitudinal direction of the optical resonator, and the third electrode was provided on the top of the absorption region. Except for the above, Sample 4 was prepared in the same manner as Sample 1.

Sample 5 had a multi-section structure, and a 40 µm absorption region was provided between the gain regions at both ends in the longitudinal direction of the optical resonator, and the third electrode was provided on the top of the absorption region. Except for the above, Sample 5 was prepared in the same manner as Sample 1.

Sample 6 had a multi-section structure, and a 50 µm absorption region was provided between the gain regions at both ends in the longitudinal direction of the optical resonator, and the third electrode was provided on the top of the absorption region. Except for the above, Sample 6 was prepared in the same manner as Sample 1.

Sample 7 had a multi-section structure, and a 60 µm absorption region was provided between the gain regions at both ends in the longitudinal direction of the optical resonator, and the third electrode was provided on the top of the absorption region. Except for the above, Sample 7 was prepared in the same manner as Sample 1.

Sample 8 had a multi-section structure, and a 80 µm absorption region was provided between the gain regions at both ends in the longitudinal direction of the optical resonator, and the third electrode was provided on the top of the absorption region. Except for the above, Sample 8 was prepared in the same manner as Sample 1.

(2) Driving Semiconductor Laser

Samples 1 to 8 prepared in (1) were irradiated with the excitation light using a titanium sapphire laser to drive the semiconductor laser. The pulse width of the excitation light was 2 ps, and the excitation intensity was 14 times the threshold of the optical resonator.

For Sample 3, the first and third electrodes were connected to the bias power supply, and the semiconductor laser was driven while applying the reverse bias voltage. The reverse bias voltage was −2 V, −4 V, −8 V, and −12 V.

For Sample 6, the first and third electrodes were connected to the bias power supply, and the semiconductor laser was driven while applying the reverse bias voltage. The reverse bias voltage was −4 V, −8 V, and −12 V.

For Sample 8, the first and third electrodes were connected to the bias power supply, and the semiconductor laser was driven while applying the reverse bias voltage. The reverse bias voltage was −8 V, and −12 V.

(3) Evaluation of Pulse Width and Peak Intensity of Optical Pulse

The results of evaluating the pulse width and the peak intensity of the optical pulse generated in (2) are illustrated in Table 1.

TABLE 1

| No. | Optical resonator | Absorption Region (µm) | Reverse bias voltage (V) | Pulse width of optical pulse (p s) | Peak intensity of optical pulse (W) |
|---|---|---|---|---|---|
| 1 | Sample 1 | 0 | — | 1.61 | 19.2 |
| 2 | Sample 2 | 10 | — | 1.25 | 17.0 |
| 3 | Sample 3 | 20 | — | 0.86 | 22.0 |
| 4 | Sample 4 | 30 | — | 0.78 | 19.7 |
| 5 | Sample 5 | 40 | — | 0.68 | 21.0 |
| 6 | Sample 6 | 50 | — | 0.56 | 25.2 |
| 7 | Sample 7 | 60 | — | 0.88 | 15.2 |
| 8 | Sample 8 | 80 | — | 0.69 | 9.6 |
| 9 | Sample 3 | 20 | −2 | 0.80 | 23.0 |
| 10 | Sample 3 | 20 | −4 | 0.78 | 25.3 |
| 11 | Sample 3 | 20 | −8 | 0.64 | 28.1 |
| 12 | Sample 3 | 20 | −12 | 0.60 | 23.5 |
| 13 | Sample 6 | 50 | −4 | 0.58 | 23.5 |
| 14 | Sample 6 | 50 | −8 | 0.62 | 19.5 |
| 15 | Sample 6 | 50 | −12 | 0.68 | 16.3 |
| 16 | Sample 8 | 80 | −8 | 0.76 | 8.8 |
| 17 | Sample 8 | 80 | −12 | 1.01 | 5.2 |

(3-1) Evaluation of Pulse Width of Optical Pulse

In No. 1, an optical pulse having a pulse width (1.61 ps) shorter than the photon lifetime (2.2 ps) of the optical resonator can be generated. In other words, it is confirmed that since the multiple quantum well structure is adopted and the super gain switching method is used, an optical pulse having a pulse width shorter than the photon lifetime in the optical resonator is generated. In the present example, a fifty-period multi-quantum well structure is adopted. However, the inventors of the present application confirm that the at least five-period multiple quantum well structure is adopted and the super gain switching method is used, so that an optical pulse having a pulse width shorter than 2.5 times the photon lifetime in the optical resonator can be generated, and furthermore an optical pulse having a pulse width shorter than the photon lifetime in the optical resonator can be generated.

In addition, in No. 2 to No. 8 adopting the multi-section structure, the optical pulse having the pulse width (0.56 to 1.25 ps) shorter than that of No. 1 (1.61 ps) adopting the single-section structure can be generated. In other words, it is confirmed that the multi-section structure is adopted, so that the pulse width of the generated optical pulse can be made much shorter. It is also confirmed that the width of the absorption region is changed, so that the pulse width of the generated optical pulse can be controlled.

In addition, in No. 9 to No. 12 in which a reverse bias voltage is applied to the absorption region, the optical pulse having the pulse width (0.60 to 0.80 ps) shorter than that of No. 3 (0.86 ps) in which a reverse bias voltage is not applied can be generated. In addition, in No. 13 to No. 15 in which a reverse bias voltage is applied to the absorption region, the optical pulse having the pulse width (0.58 to 0.68 ps) longer than that of No. 6 (0.56 ps) in which a reverse bias voltage is not applied can be generated. In addition, in No. 16 to No. 17 in which a reverse bias voltage is applied to the absorption region, the optical pulse having the pulse width (0.76 to 1.01 ps) longer than that of No. 8 (0.69 ps) in which a reverse bias voltage is not applied can be generated. Thus, it is confirmed that an amount of the applied reverse bias voltage is controlled, so that the pulse width of the generated optical pulse can be fine-tuned.

(3-2) Evaluation of Peak Intensity of Optical Pulse

In No. 1 to No. 8, the peak intensity of the optical pulse varied in a range of 9.6 to 25.2 W. That is, it is confirmed that the width of the absorption region is changed, so that the peak intensity of the generated optical pulse can be controlled.

In addition, in No. 9 to No. 12 in which a reverse bias voltage is applied to the absorption region, the optical pulse having the peak intensity (23.0 to 28.1 W) larger than that of No. 3 (22.0 W) in which a reverse bias voltage is not applied can be generated. In addition, in No. 13 to No. 15 in which a reverse bias voltage is applied to the absorption region, the optical pulse having the peak intensity (16.3 to 23.5 W) smaller than that of No. 6 (25.2 W) in which a reverse bias voltage is not applied can be generated. In addition, in No. 16 to No. 17 in which a reverse bias voltage is applied to the absorption region, the optical pulse having the peak intensity (5.2 to 8.8 W) smaller than that of No. 8 (9.6 W) in which a reverse bias voltage is not applied can be generated. Thus, it is confirmed that an amount of the applied reverse bias voltage is controlled, so that the peak intensity of the generated optical pulse can be controlled.

Preferable Aspects of the Present Invention

Hereinafter, supplementary descriptions of the preferred aspects of the present invention will be given.

Supplementary Description 1

According to an aspect of the present invention,
there is provided a semiconductor laser including:
an optical resonator that has a first compound semiconductor layer containing an n-type impurity, a second compound semiconductor layer containing a p-type impurity, and a light-emitting layer provided between the first compound semiconductor layer and the second compound semiconductor layer; and a pulse injection means that injects excitation energy for a sub-nanosecond (less than 1 ns) duration into the optical resonator, wherein the optical resonator has a multi-section structure separated into at least one gain region and at least one absorption region, and the semiconductor laser generates optical pulses having a pulse width shorter than 2.5 times a photon lifetime in the optical resonator.
Preferably, the pulse width of the optical pulse is shorter than 2.0 times the photon lifetime. More preferably, the pulse width of the optical pulse is shorter than 1.5 times the photon lifetime. Preferably, the duration is less than 600 ps. More preferably, the duration is less than 70 ps. The duration may be set within a range of less than 900 ps, for example, or may be set within a range of less than 800 ps, for example, or may be set within a range of less than 700 ps, for example, or may be set within a range of less than 600 ps, for example, or may be set within a range of less than 500 ps, for example, or may be set within a range of less than 400 ps, for example, or may be set within a range of less than 300 ps, for example, or may be set within a range of less than 200 ps, for example, or may be set within a range of less than 100 ps, for example.

Supplementary Description 2

The semiconductor laser according to the supplementary description 1, wherein the optical resonator has a multi-section structure separated into the at least one gain region and the at least one absorption region along an oscillation direction.

Supplementary Description 3

The semiconductor laser according to the supplementary description 1, wherein the optical resonator has a multi-section structure separated into the at least one gain region and the at least one absorption region along an oscillation direction.

Supplementary Description 4

The semiconductor laser according to any one of the supplementary descriptions 1 to 3, wherein the semiconductor laser generates optical pulses having a pulse width shorter than the photon lifetime in the optical resonator (the duration for which the excitation energy is injected is set so that the pulse width of the optical pulse is shorter than the photon lifetime in the optical resonator). Preferably, the pulse width of the optical pulse is less than 1 ps.

Supplementary Description 5

The semiconductor laser according to any one of the supplementary descriptions 1 to 4, wherein the light-emitting layer has an at least five-period multiple quantum well structure. Preferably, the light-emitting layer has an at least ten-period multiple quantum well structure. More preferably, the light-emitting layer has an at least twenty-period multiple quantum well structure.

Supplementary Description 6

The semiconductor laser according to any one of the supplementary descriptions 1 to 5, further including a means to apply a reverse bias voltage to the absorption region.

DESCRIPTION OF NUMERALS

10 Semiconductor laser
11 Pulse injection means
20 Optical resonator
21 First compound semiconductor layer
22 Second compound semiconductor layer
23 Light-emitting layer
24 Well layer
25 Barrier layer
31 First electrode 32 Second electrode
33 Insulation layer
70 Semiconductor laser
71 Optical resonator
72 Bias power supply
73 Third electrode
74 Separation groove
80 Optical resonator
91 Optical resonator
Z1 Gain region
Z2 Absorption region
Z3 Ion implantation region

The invention claimed is:

1. A semiconductor laser comprising:
an optical resonator that has a first compound semiconductor layer containing an n-type impurity, a second compound semiconductor layer containing a p-type impurity, and a light-emitting layer provided between the first compound semiconductor layer and the second compound semiconductor layer;
a first electrode electrically connected to the first compound semiconductor layer;
a second electrode electrically connected to the second compound semiconductor layer;
an insulation layer provided to cover a part of the second compound semiconductor layer; and
a pulse injection means connected to the first electrode and the second electrode,
wherein the light-emitting layer has a multiple quantum well structure in which at least five well layers and at least five barrier layers are alternately stacked,
the optical resonator has a multi-section structure separated into at least one gain region and at least one absorption region along an oscillation direction,
the pulse injection means is configured to apply a pulse current for a duration of less than 1 ns to the first electrode and the second electrode,
an electrode area of the second electrode is set so that the excitation energy is injected for a sub-nanosecond duration into the optical resonator when the pulse current is applied to the first electrode and the second electrode,
a stray capacitance around the insulation layer is set so that the excitation energy is injected for a sub-nanosecond duration into the optical resonator when the pulse current is applied to the first electrode and the second electrode, and
the semiconductor laser generates optical pulses having a pulse width shorter than 2.5 times a photon lifetime in the optical resonator.

2. The semiconductor laser according to claim 1, wherein the semiconductor laser generates optical pulses having a pulse width shorter than the photon lifetime in the optical resonator.

3. The semiconductor laser according to claim 2, wherein the light-emitting layer has an at least five-period multiple quantum well structure.

4. The semiconductor laser according to claim 3, further comprising a means to apply a reverse bias voltage to the absorption region.

5. The semiconductor laser according to claim 2, further comprising a means to apply a reverse bias voltage to the absorption region.

6. The semiconductor laser according to claim 1, wherein the light-emitting layer has an at least five-period multiple quantum well structure.

7. The semiconductor laser according to claim 6, further comprising a means to apply a reverse bias voltage to the absorption region.

8. The semiconductor laser according to claim 1, further comprising a means to apply a reverse bias voltage to the absorption region.

9. The semiconductor laser according to claim 1, wherein the light-emitting layer has an at least twenty-period multiple quantum well structure in which at least twenty well layers and at least twenty barrier layers are alternately stacked.

* * * * *